(12) United States Patent
Babcock et al.

(10) Patent No.: US 7,307,314 B2
(45) Date of Patent: Dec. 11, 2007

(54) LDMOS TRANSISTOR WITH IMPROVED GATE SHIELD

(75) Inventors: Jeff Babcock, Sunnyvale, CA (US); Johan Agus Darmawan, Cupertino, CA (US); John Mason, Sunnyvale, CA (US); Ly Diep, San Jose, CA (US)

(73) Assignee: Cree Microwave LLC, Durham, NC (US)

( * ) Notice: Subject to any disclaimer, the term of this patent is extended or adjusted under 35 U.S.C. 154(b) by 178 days.

(21) Appl. No.: 10/870,753

(22) Filed: Jun. 16, 2004

(65) Prior Publication Data

US 2005/0280080 A1    Dec. 22, 2005

(51) Int. Cl.
*H01L 29/76* (2006.01)
(52) U.S. Cl. .................. 257/335; 257/340; 257/409; 257/630; 257/E21.427; 257/E29.04; 257/E29.268; 257/E21.452; 257/E29.116; 257/E29.317
(58) Field of Classification Search ........ 257/335–336, 257/340, 344, 408–409, 491–492, 630
See application file for complete search history.

(56) References Cited

U.S. PATENT DOCUMENTS

| | | | | |
|---|---|---|---|---|
| 5,252,848 A * | 10/1993 | Adler et al. | ................. | 257/328 |
| 5,665,639 A * | 9/1997 | Seppala et al. | ................. | 438/15 |
| 5,869,875 A | 2/1999 | Hebert | ................. | 257/328 |
| 6,211,568 B1 * | 4/2001 | Hong | ................. | 257/754 |
| 6,215,152 B1 | 4/2001 | Hebert | ................. | 257/340 |
| 6,506,648 B1 * | 1/2003 | Hebert et al. | ................. | 438/286 |
| 6,744,117 B2 * | 6/2004 | Dragon et al. | ................. | 257/659 |
| 7,119,399 B2 * | 10/2006 | Ma et al. | ................. | 257/341 |
| 2002/0033508 A1* | 3/2002 | Morikawa et al. | ................. | 257/368 |
| 2002/0102800 A1* | 8/2002 | Van Den Heuvel | ................. | 438/301 |
| 2002/0163016 A1* | 11/2002 | Shibata | ................. | 257/200 |
| 2005/0087845 A1* | 4/2005 | Norstrom et al. | ................. | 257/659 |
| 2006/0040441 A1* | 2/2006 | Lotfi et al. | ................. | 438/223 |

\* cited by examiner

*Primary Examiner*—A. Sefer
(74) *Attorney, Agent, or Firm*—Myers Bigel Sibley & Sajovec

(57) ABSTRACT

A LDMOS transistor having a gate shield provides reduced drain coupling to the gate shield and source by restricting the thickness of the gate shield and by confining a source contact to the source region without overlap of the gate.

7 Claims, 12 Drawing Sheets

TiWN is conductive

LDMOS TRANSISTOR WITH IMPROVED GATE SHIELD

CROSS-REFERENCE TO RELATED APPLICATIONS

This application is related to applications Ser. No. 10/870,012, filed Jun. 16, 2004, entitled LDMOS TRANSISTOR HAVING GATE SHIELD AND TRENCH SOURCE CAPACITOR, Ser. No. 10/870,720, filed Jun. 16, 2004, entitled LATERALLY DIFFUSED MOS TRANSISTOR HAVING N+ SOURCE CONTACT TO N-DOPED SUBSTRATE, and Ser. No. 10/870,795, filed Jun. 16, 2004, entitled LATERALLY DIFFUSED MOS TRANSISTOR HAVING INTEGRAL SOURCE CAPACITOR AND GATE SHIELD, all of which are incorporated herein by reference for all purposes.

BACKGROUND OF THE INVENTION

This invention relates generally to semiconductor transistors, and more particularly the invention relates to laterally diffused MOS (LDMOS) transistors.

The LDMOS transistor is used in RF/microwave power amplifiers. The device is typically fabricated in an epitaxial silicon layer (P−) on a more highly doped silicon substrate (P+). A grounded source configuration is achieved by a deep P+ sinker diffusion from the source region to the P+ substrate, which is grounded. (See, for example, U.S. Pat. No. 5,869,875.)

The gate to drain feedback capacitor (CGD) of any MOSFET device must be minimized in order to maximize RF gain and minimize signal distortion. The gate to drain feedback capacitance is critical since it is effectively multiplied by the voltage gain of the device.

Heretofore, the use of a Faraday shield made of metal or polysilicon formed over the gate structure has been proposed as disclosed in U.S. Pat. No. 5,252,848. (See, also U.S. Pat. No. 6,215,152 for MOSFET HAVING SELF-ALIGNED GATE AND BURIED SHIELD AND METHOD OF MAKING SAME.)

It would be advantageous to connect the gate shield to RF ground to further reduce RF signal feedback from the drain to the gate and source.

The source contact and gate shield are ohmically connected, and this connection is readily implemented by extending the source contact metal over the gate structure and, in effect, becoming the gate shield. However, this structure has high drain to source and shield capacitance.

SUMMARY OF THE INVENTION

In accordance with one embodiment of the present invention, a LDMOS transistor has a gate shield which is interconnected with the source contact but does not comprise the source contact metal. The shield structure is thin relative to the drain contact to thereby reduce coupling capacitance to the drain contact and with the shield structure extending to and contacting the source contact. The structure is readily fabricated using conventional semiconductor processing.

In accordance with another embodiment of the invention, planarity of the structure can be enhanced by plating the source, drain, and shield to different levels to realize a total planar structure.

The invention and objects and features thereof will be more readily apparent from the following detailed description and appended claims when taken with the drawings.

DETAILED DESCRIPTION OF ILLUSTRATIVE EMBODIMENTS

Figure 1A:
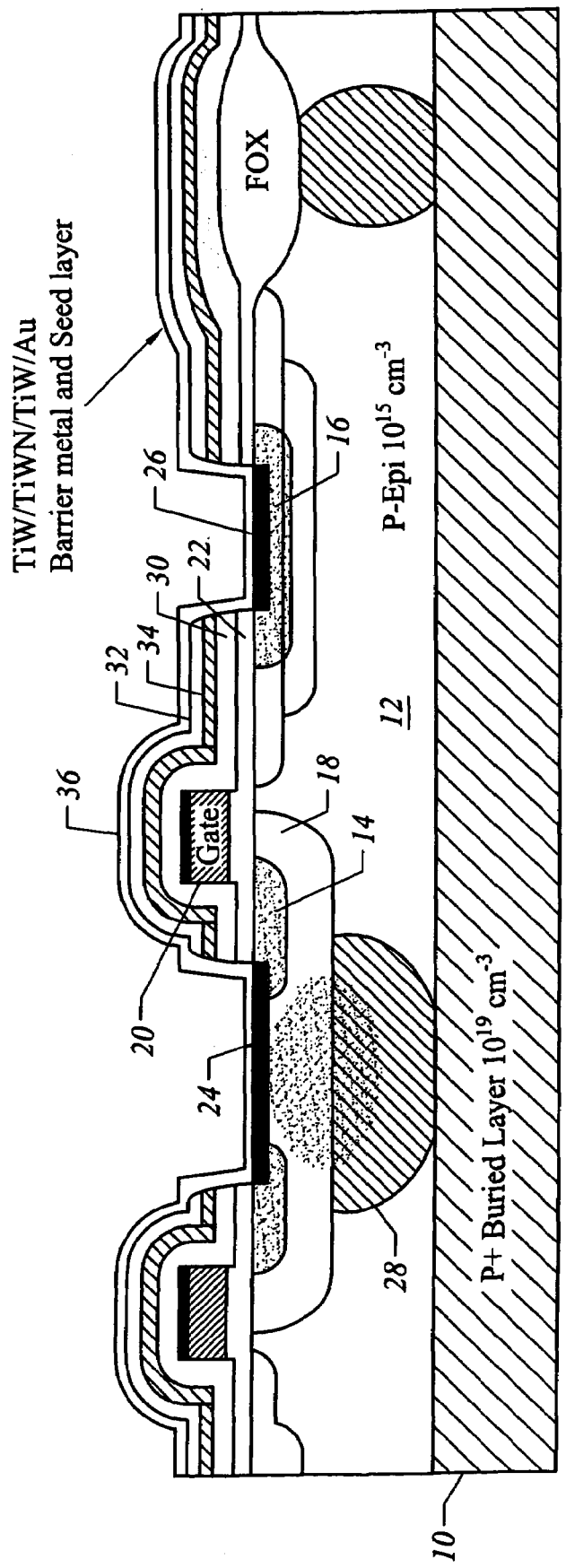
FIGS. 1A-1E are side views in section illustrating steps in fabricating a LDMOS transistor with gate shield in accordance with the prior art.

FIGS. 1A-1E are side views in section of the LDMOS transistor having a gate shield fabricated in accordance with prior art. The transistor is fabricated on a P+ substrate 10 which has a P− epitaxial layer 12 thereon. A source region 14 and drain region 16 are formed in a surface of epitaxial layer 12 with a P channel region 18 therebetween. Overlying channel 18 is a gate 20 which is insulated from channel 18 by gate dielectric 22, typically silicon oxide or silicon nitride. A source contact 24 is made to source 14 and also to an extension of P channel region 18, and a drain contact 26 is made to drain region 16. A P+ sinker layer 28 ohmically connects source contact 24 to P+ substrate 10.

Overlying gate 20 are silicon oxide layers 30, 32 and silicon nitride layer 34 which collectively provide insulation between conductive layer 36 and the underlying gate 20. Conductive layer 36 extends to source contact 24 and comprises titanium tungston/titanium tungston nitride/titanium tungston/gold (TiW/TiWN/TiW/Au) with the gold being a coating for facilitating later plating of gold. The TiWN layer functions as a barrier to the diffusion of gold atoms. Layer 36 extends to contacts 24, 26 which can comprise the same stacked metal layers.

Figure 1B:
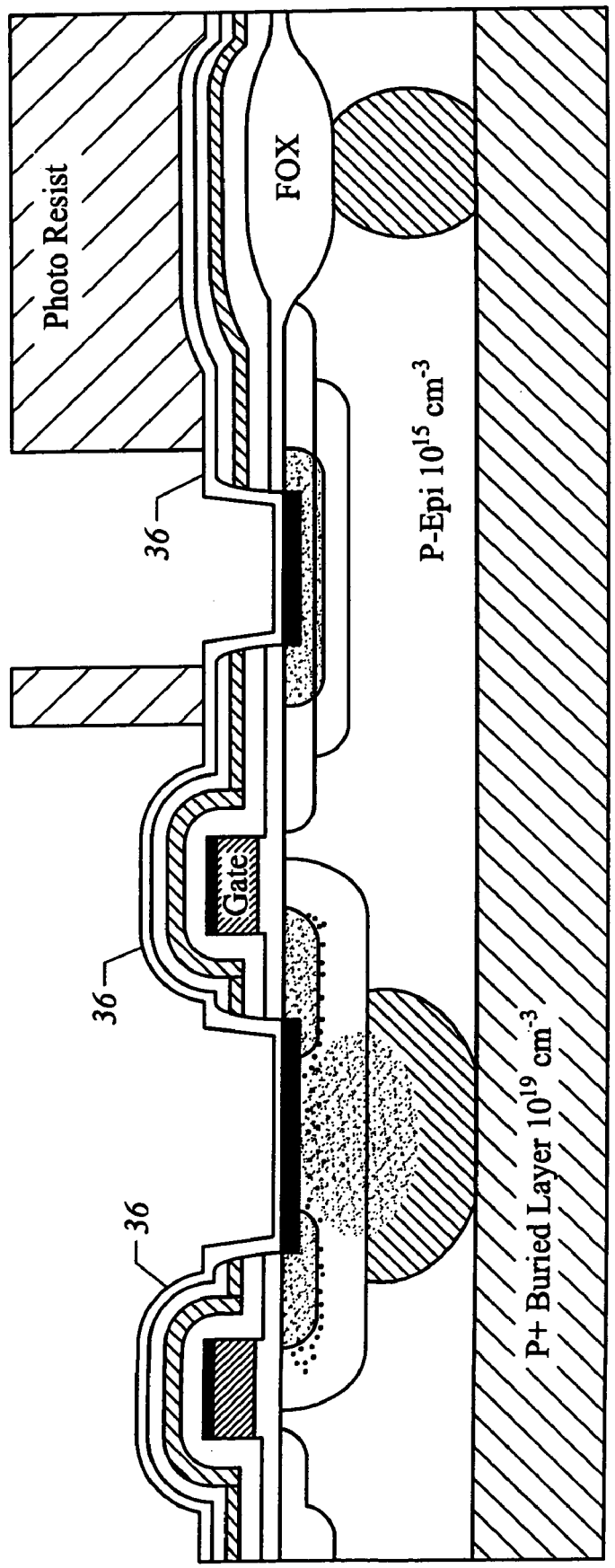
Figure 1C:
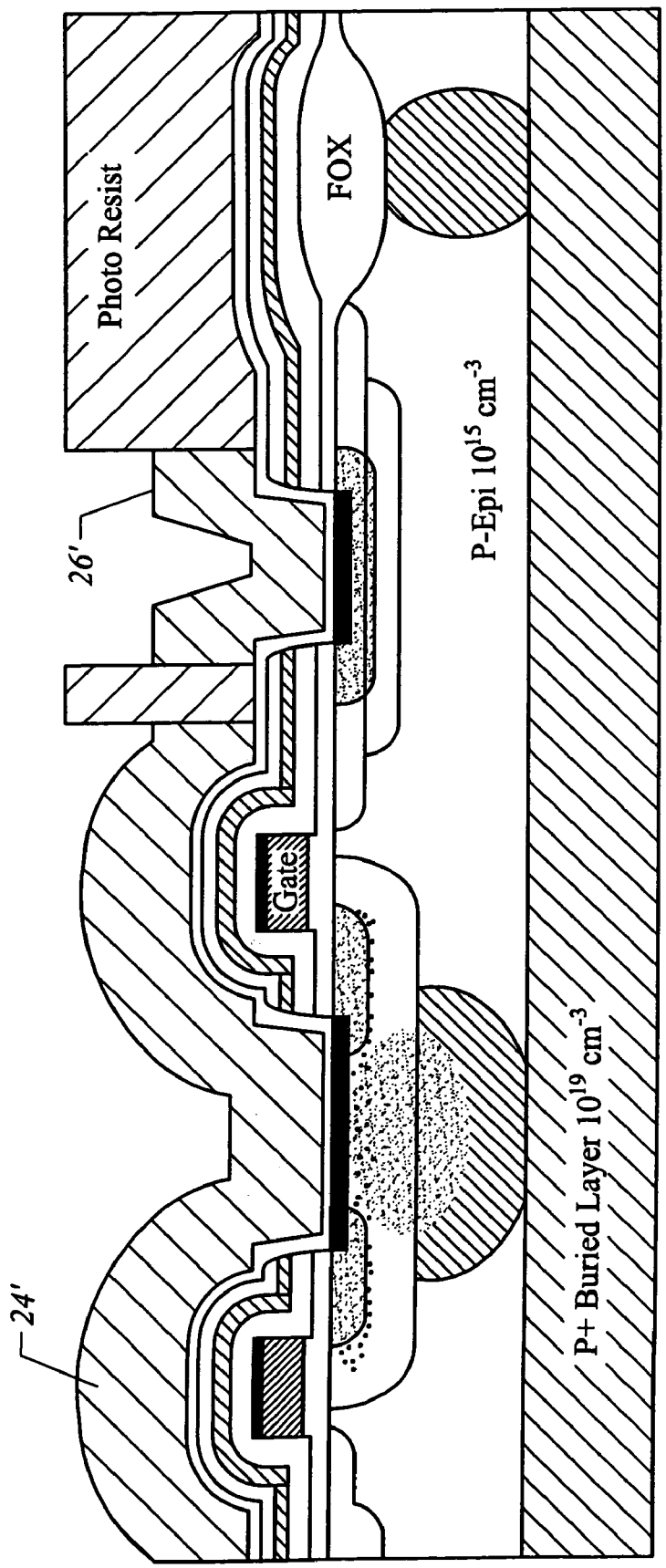

In accordance with the prior art, a photoresist mask is applied over the structure as shown in FIG. 1B for the subsequent plating of gold on the exposed gold coating of stacked layer 36 for source contact 24' and drain contact 26', as illustrated in FIG. 1C. Here the gold coating 24' over source contact 24 overlaps gate 20 to the photoresist mask, and plated gold contact 26', to drain contact 26 is limited to the drain region by the photoresist mask. Gold does not stick to the photoresist mask.

Figure 1D:
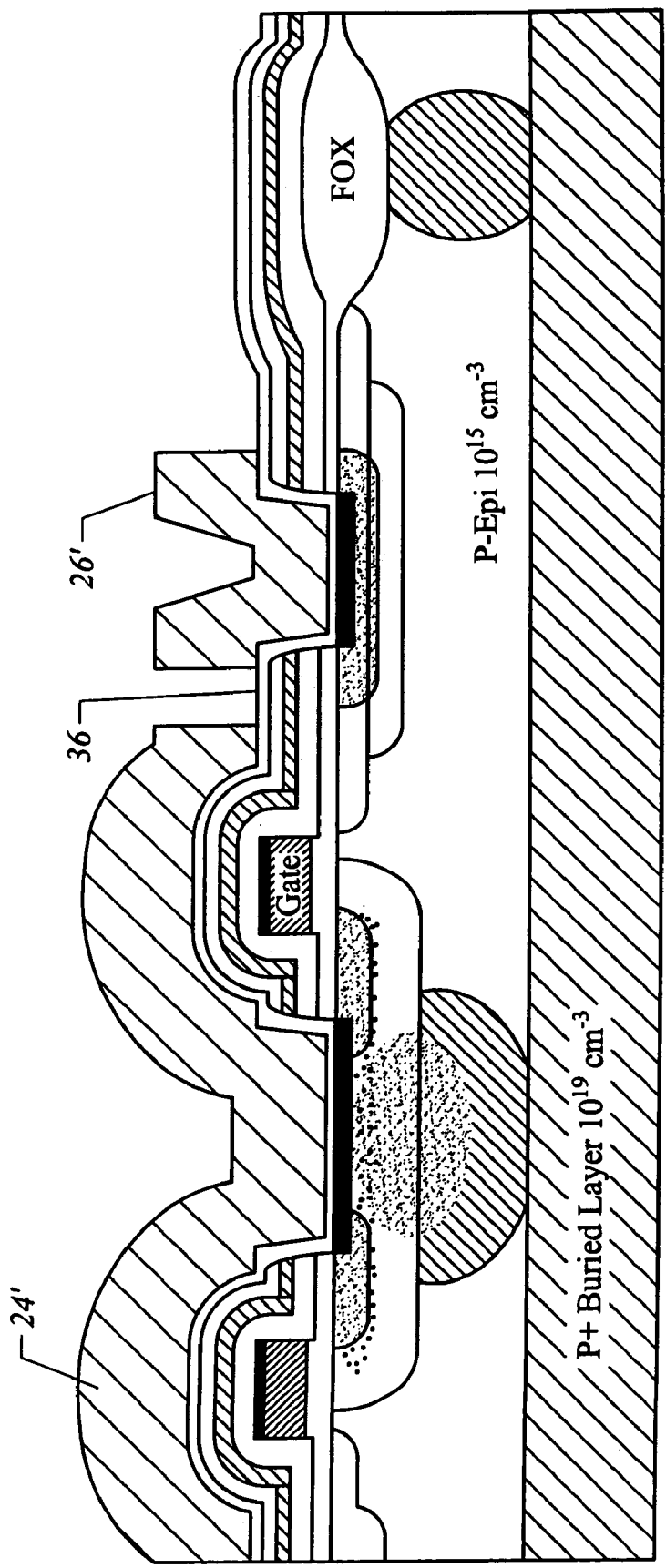
Figure 1E:
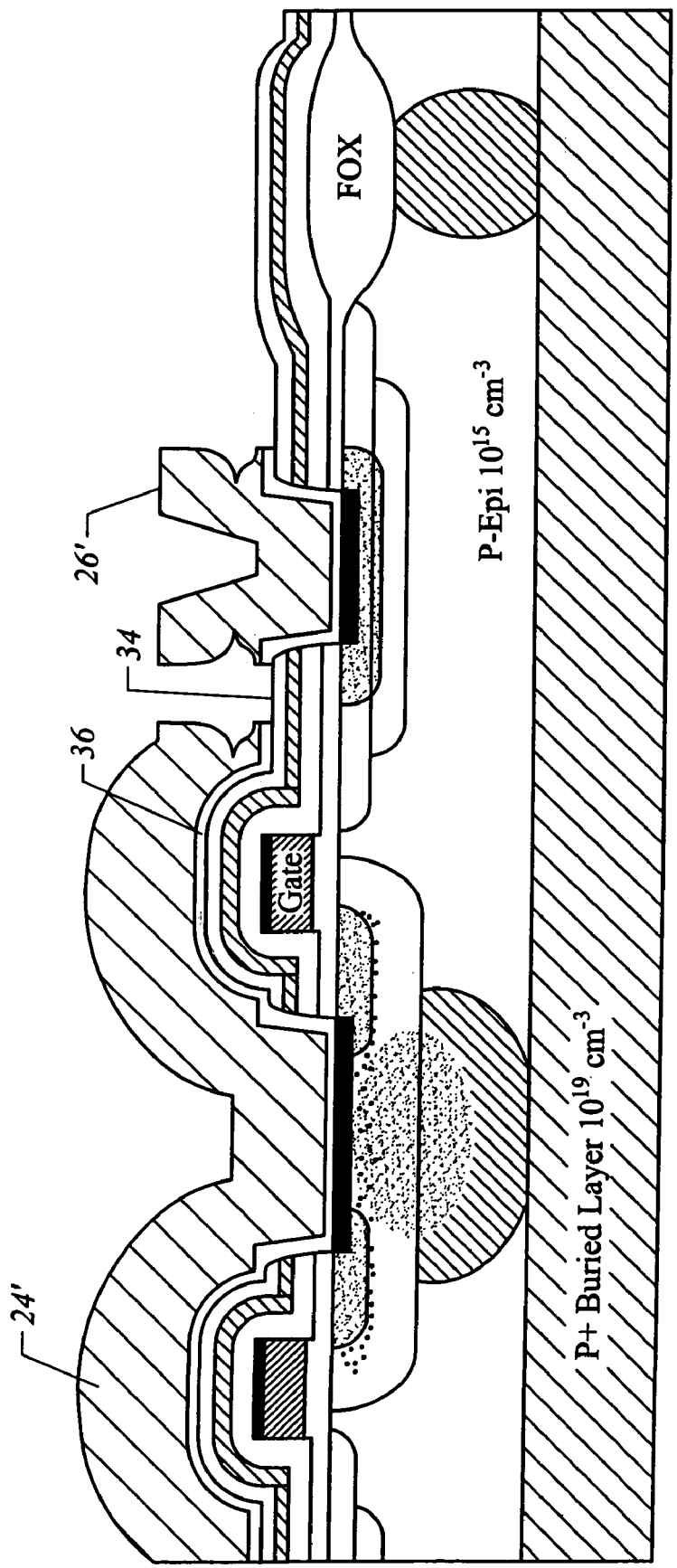

The photoresist mask is removed as shown in FIG. 1D, and thereafter the exposed stacked layer 36 is etched as shown in FIG. 1E to disconnect stacked metal layer 36 from the drain contact 26'. The thin gold coating of stacked metal layers 36 is readily removed with an aqua regia etch without significantly etching source contact 24' and drain contact 26'. Thereafter, the TiW layers are removed by dry etch in a plasma etch chamber followed by a wet etch for removing any residual TiW.

Thus, the gate shield of LDMOS transistor as shown in FIG. 1E utilizes the plated gold for the source contact and the gate shield also. While the gate shield is spaced from and disconnected from drain contact 26', the relative thickness of the plated gold provides significant coupling of the drain contact to the gate shield.

Figure 2A:
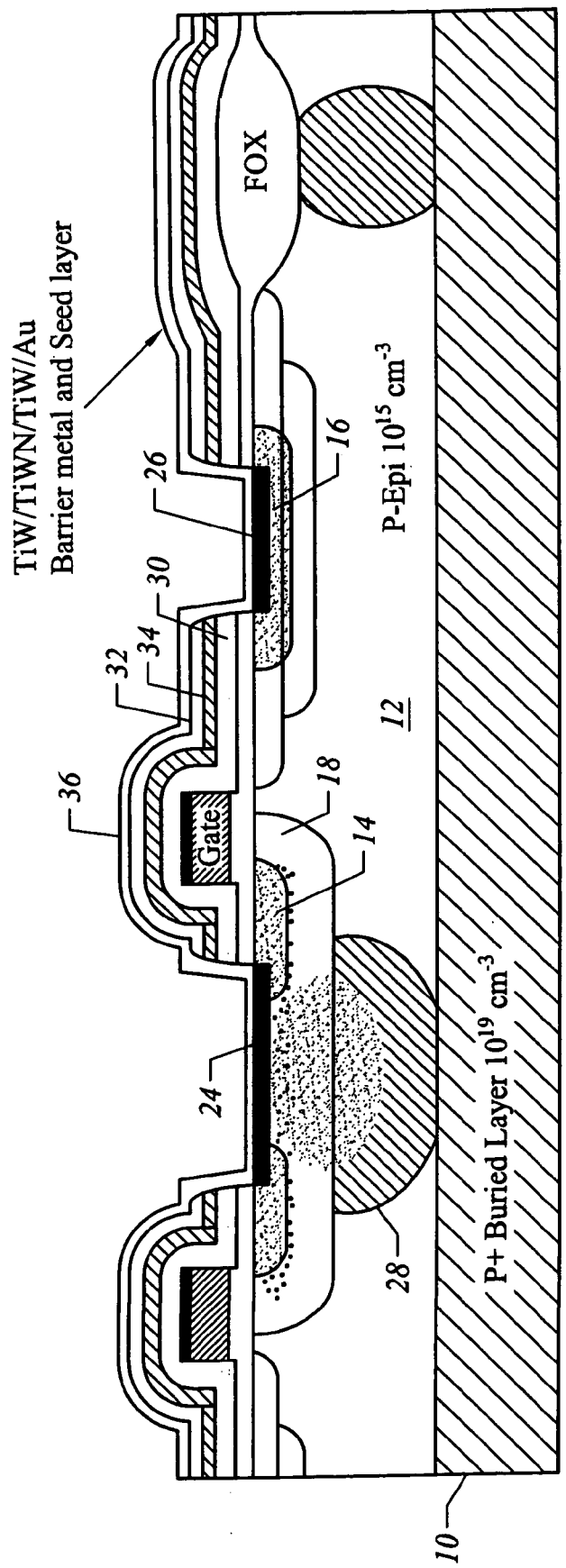
FIGS. 2A-2G are side views in section illustrating the fabrication of the LDMOS transistor with gate shield in accordance with one embodiment of the invention.
Figure 2B:
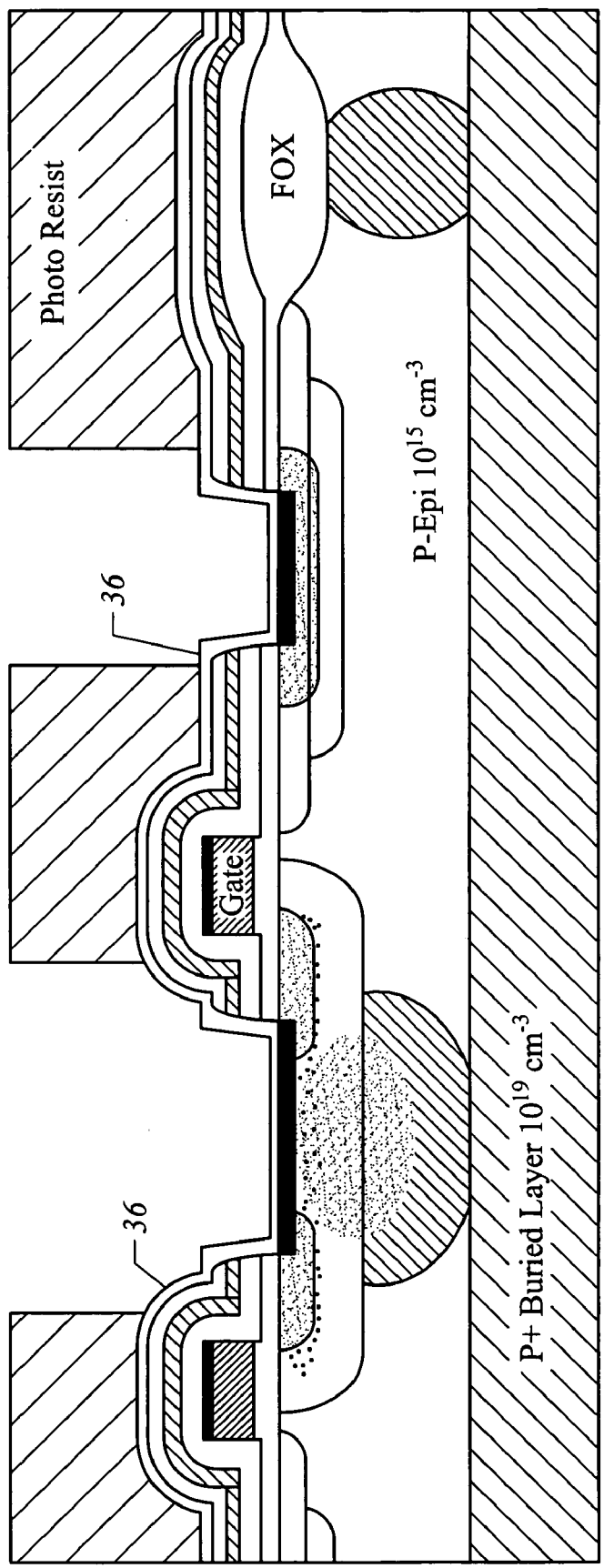
Figure 2C:
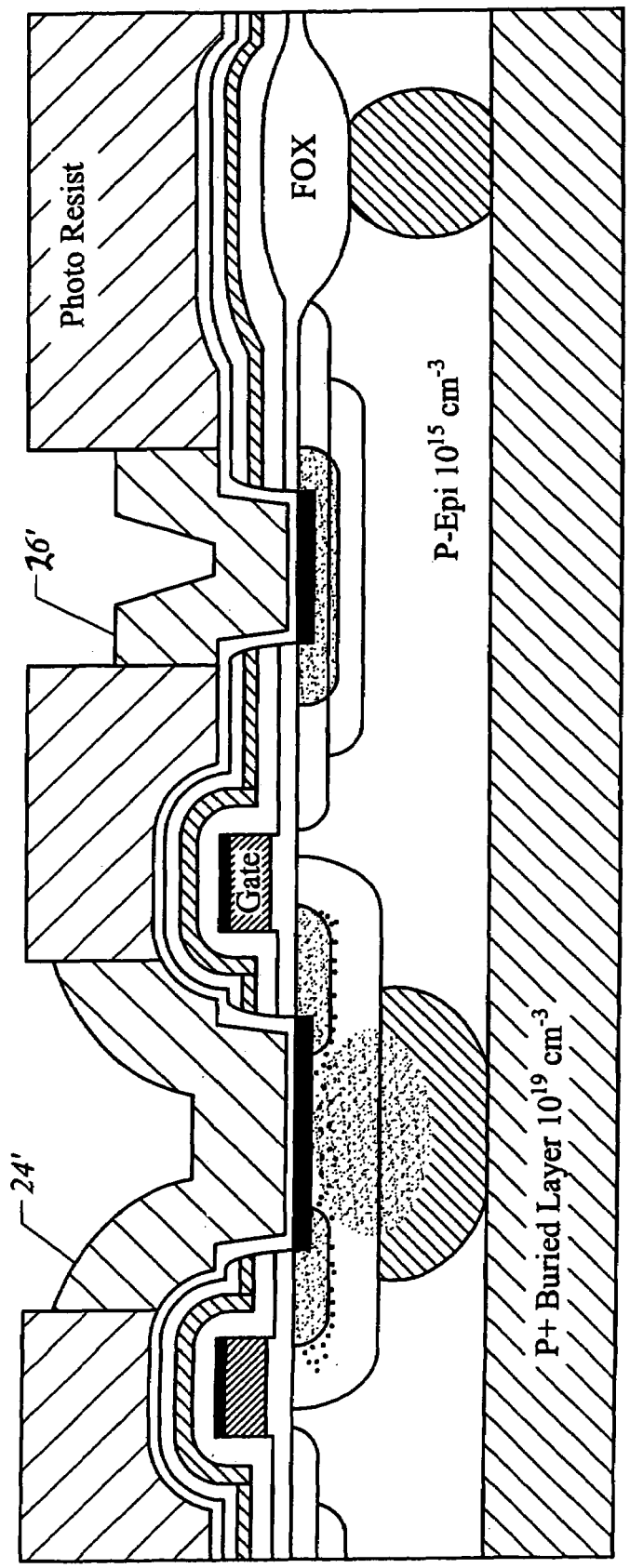

FIGS. 2A-2E are side views in section of steps in fabricating an LDMOS transistor with gate shield in accordance with an embodiment of the present invention. FIG. 2A is essentially the same as FIG. 1A and the same reference numerals are used. At this stage, the transistor structure is essentially completed except for the gate shield and contacts. FIG. 2B is similar to FIG. 1B except it will be noted that the mask between the drain contact and gate is extended over the gate structure. Accordingly, when gold is plated on the exposed gold coating of stacked metal layers 36, source contact 24' is restricted to the source region and does not overlap gate 20. Drain contact 26' is essentially the same as the drain contact in FIG. 1C.

Figure 2D:
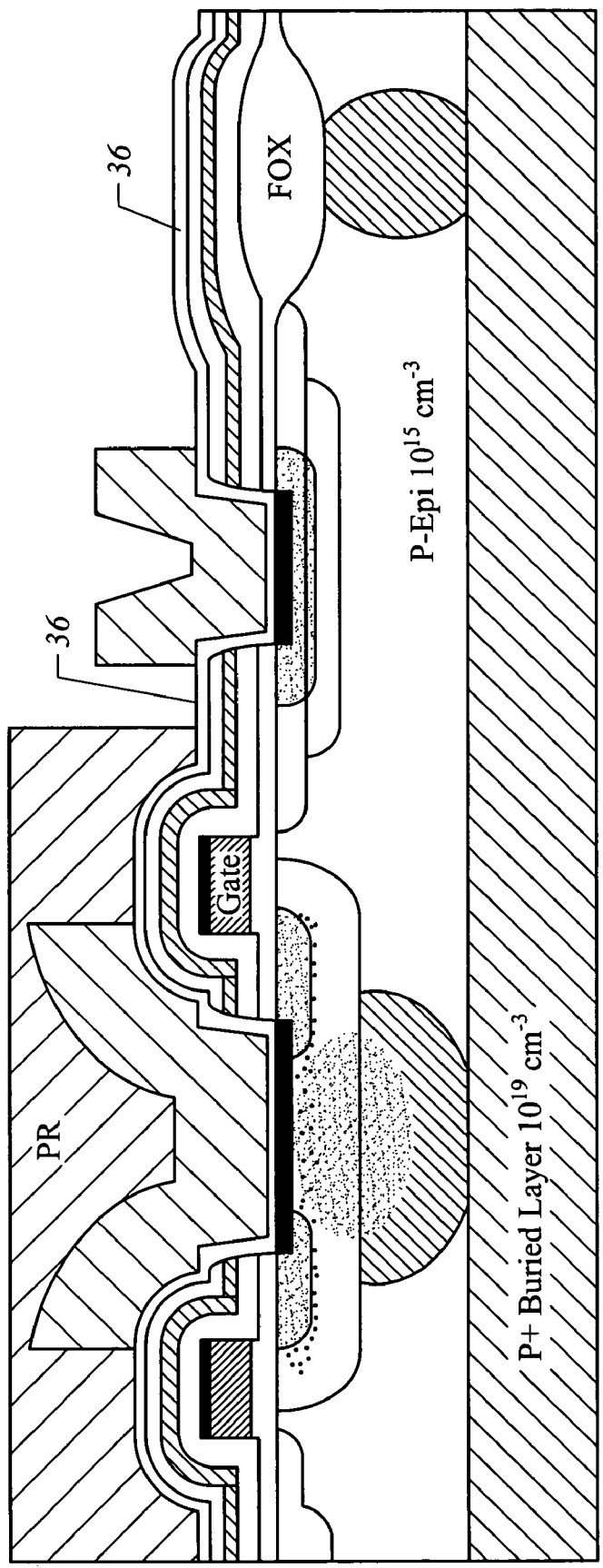
Figure 2E:
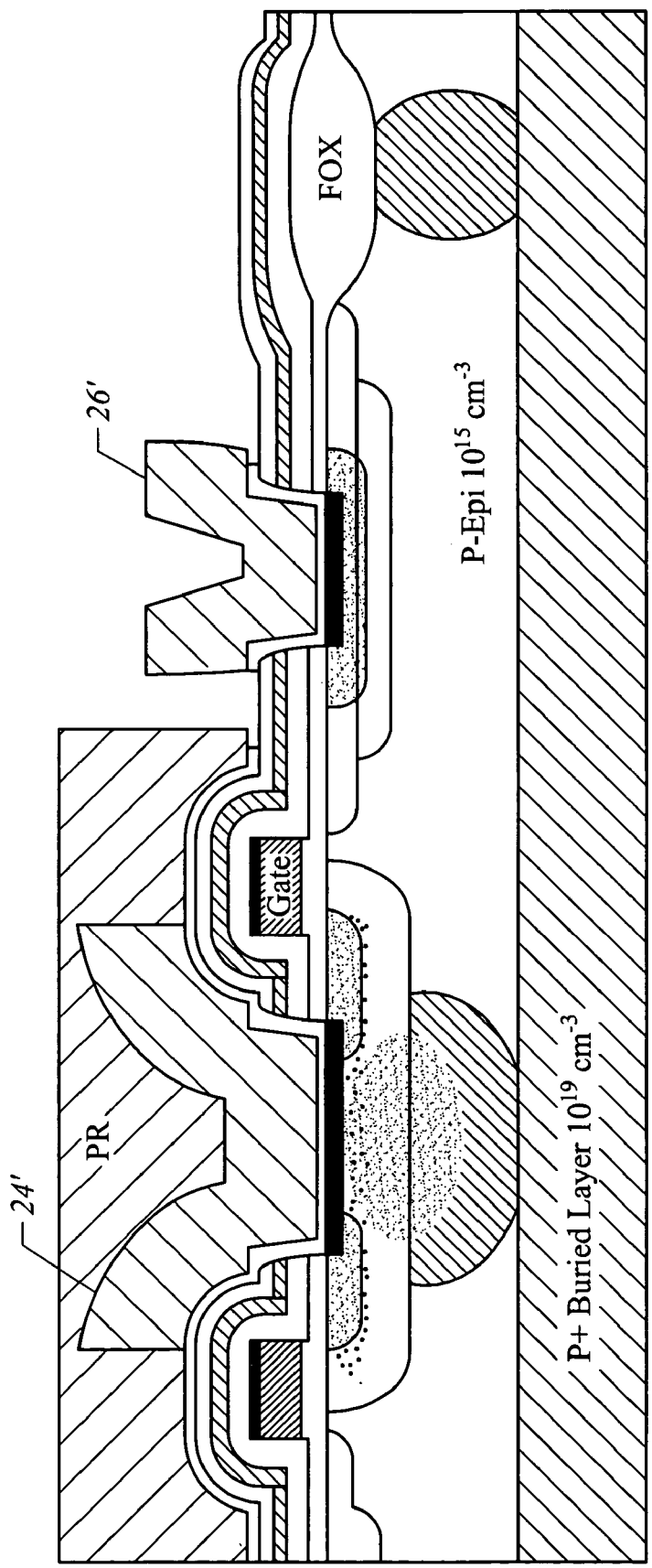
Figure 2F:
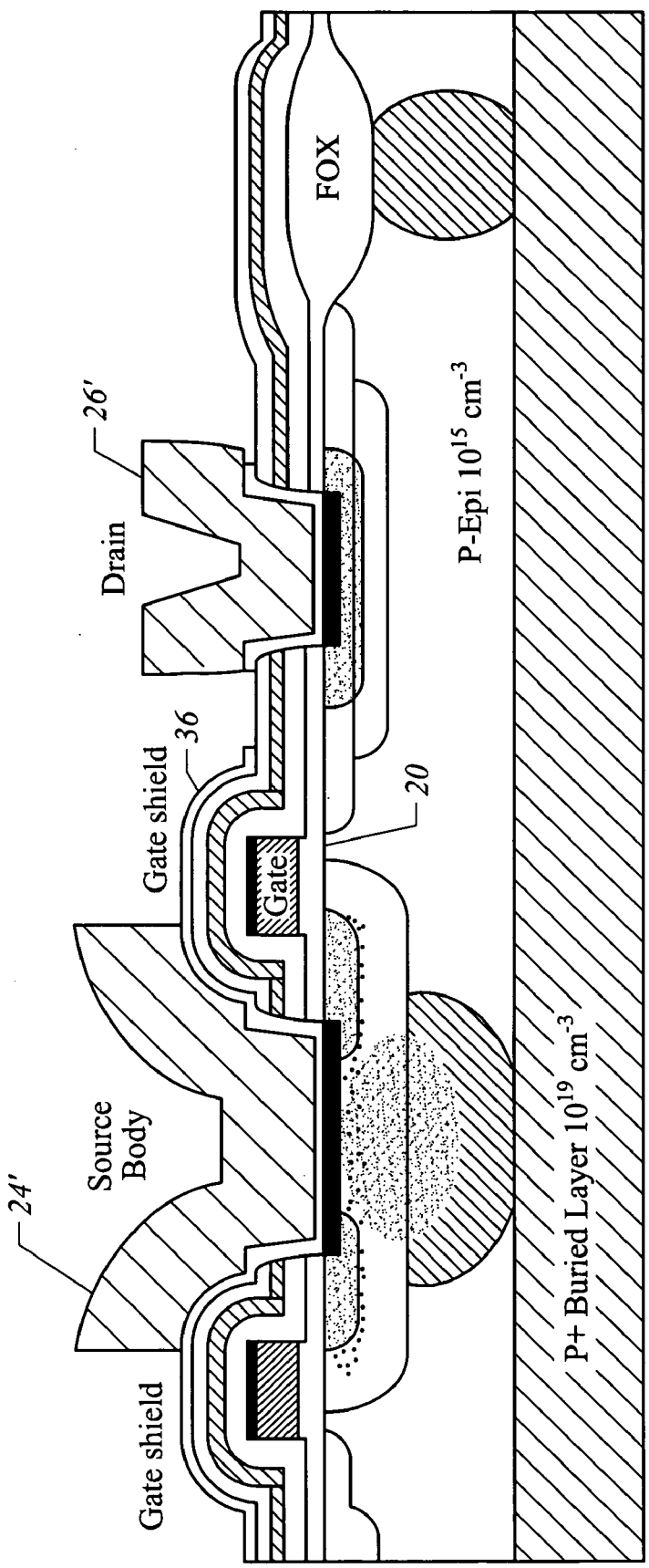

Thereafter, the photoresist mask of FIG. 1C is removed and a new mask is applied over the gate shield as shown in FIG. 2D. In FIG. 2E, the exposed stacked metal layer 36 is again etched to separate the gate shield from drain contact 26' with limited etching to remove the gold seed layer on stacked layer 36 not significantly affecting the gold contact 24' and 26'. The photoresist over the gate shield of FIG. 2E is then removed with the final structure shown in FIG. 2F in which plated source contact 24' is restricted to the source region area without overlap of gate 20. The gate shield comprises essentially the stacked metal layer 36 over the gate region which ohmically contacts plated source contact 24' but is spaced from the drain contact 26'. The reduced thickness of the gate shield in FIG. 2F vis—vis the gate shield in FIG. 1E significantly reduces drain to gate and drain to source coupling capacitance and thereby reduces RF feedback from the drain to the gate and source.

Figure 2G:
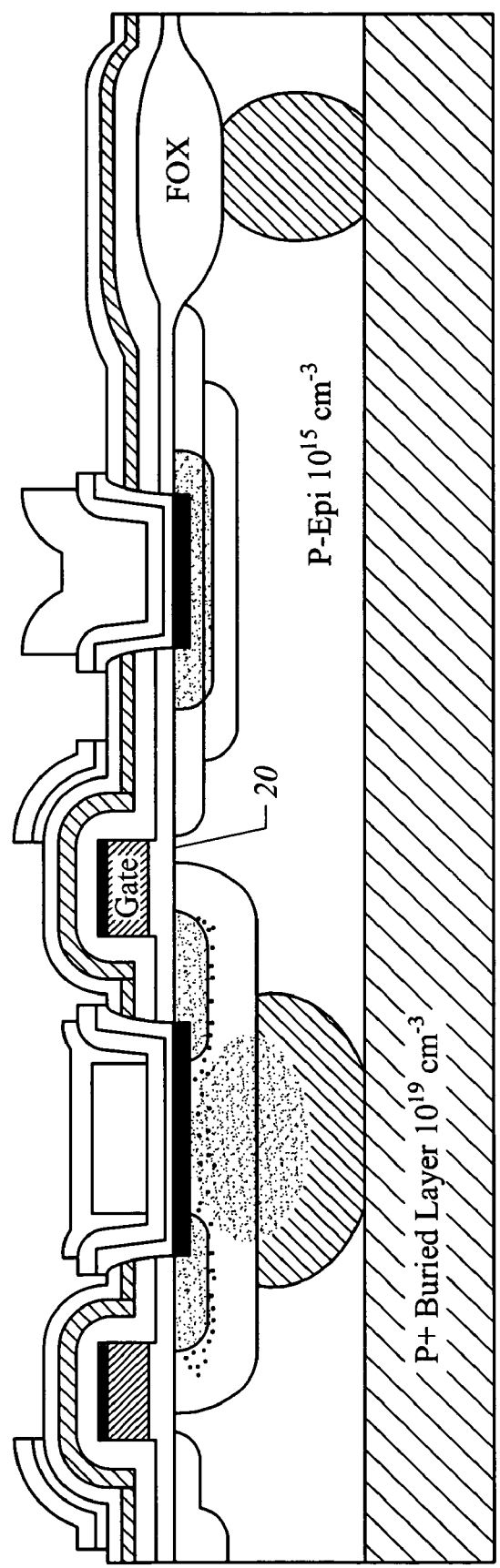

The structure can be planarized as shown in FIG. 2G by masking and plating the source and drain contacts a plurality of times whereby gold builds up over the source and drain.

While the invention has been described with reference to a specific embodiment, the description is illustrative of the invention and is not to be construed as the invention. Various modifications may occur to those skilled in the art without departing from the true spirit and scope of the invention as defined by the appended claims.

What is claimed is:

1. A LDMOS transistor comprising:
   a) a semiconductor substrate having a major surface,
   b) a source region and a drain region formed in the major surface with a channel region therebetween,
   c) a gate overlying the major surface and the channel region with a gate insulator between the gate and channel region,
   d) a source contact including a plated metal electrically connected to the source region and a drain contact including plated metal electrically connected to the drain region, and
   e) a metal gate shield overlying the gate and insulated therefrom, the gate shield extending to the source contact without the source contact plated metal overlying the gate, whereby the gate shield is thin relative to the thickness of the source contact and the drain contact and thereby reduces coupling capacitance between the gate shield and the drain contacts;
   wherein a portion of the source contact that is thicker than the gate shield extends over the gate shield and over the sate insulator, and wherein the gate shield extends beneath the source contact to contact the source region, whereby the source contact is electrically connected to the source region through the gate shield.

2. The LDMOS transistor as defined in claim 1 wherein the shield comprises stacked metal layers including a top gold seed layer and an intermediate gold diffusion barrier layer.

3. The LDMOS transistor as defined in claim 2 wherein the shield comprises TiW—TiWN—TiW—Au.

4. The LDMOS transistor as defined in claim 2 wherein the substrate includes an epitaxial layer, the source region and the drain region being formed in a surface of the epitaxial layer.

5. The LDMOS transistor as defined by claim 4 and further including a highly doped sinker region ohmically connecting the source region to the substrate underlying the epitaxial layer.

6. The LDMOS transistor as defined by claim 4 wherein the substrate is P+ doped and the epitaxial layer is P− doped.

7. The LDMOS transistor as defined by claim 4 wherein the source contact and the drain contact are planarized by repeated plating of metal thereon.

* * * * *

UNITED STATES PATENT AND TRADEMARK OFFICE
CERTIFICATE OF CORRECTION

| | | |
|---|---|---|
| PATENT NO. | : 7,307,314 B2 | Page 1 of 1 |
| APPLICATION NO. | : 10/870753 | |
| DATED | : December 11, 2007 | |
| INVENTOR(S) | : Babcock et al. | |

It is certified that error appears in the above-identified patent and that said Letters Patent is hereby corrected as shown below:

Column 4, Claim 1, Line 11: Please correct "contacts;"
                               To read -- contact; --

Column 4, Claim 1, Line 14: Please correct "sate insulator"
                               To read -- gate insulator --

Signed and Sealed this

Fifteenth Day of April, 2008

JON W. DUDAS
*Director of the United States Patent and Trademark Office*